(12) United States Patent
Rouvala et al.

(10) Patent No.: US 9,559,288 B2
(45) Date of Patent: Jan. 31, 2017

(54) APPARATUS THAT CHANGES PHYSICAL STATE AND A METHOD

(71) Applicant: Nokia Corporation, Espoo (FI)

(72) Inventors: Markku Antti Kyosti Rouvala, Helsinki (FI); Johan Kildal, Helsinki (FI)

(73) Assignee: Nokia Technologies Oy, Espoo (FI)

( * ) Notice: Subject to any disclaimer, the term of this patent is extended or adjusted under 35 U.S.C. 154(b) by 369 days.

(21) Appl. No.: 14/160,924

(22) Filed: Jan. 22, 2014

(65) Prior Publication Data

US 2015/0207058 A1    Jul. 23, 2015

(51) Int. Cl.
| | |
|---|---|
| *H01L 41/09* | (2006.01) |
| *H01L 41/053* | (2006.01) |
| *H01L 41/193* | (2006.01) |
| *G06F 3/01* | (2006.01) |
| *F03G 7/06* | (2006.01) |
| *F03G 7/00* | (2006.01) |

(52) U.S. Cl.
CPC ........... *H01L 41/0986* (2013.01); *F03G 7/005* (2013.01); *F03G 7/06* (2013.01); *G06F 3/016* (2013.01); *H01L 41/053* (2013.01); *H01L 41/0536* (2013.01); *H01L 41/193* (2013.01)

(58) Field of Classification Search
CPC .............................. H01L 41/053; H01L 41/193
USPC ......................................................... 310/328
See application file for complete search history.

(56) References Cited

U.S. PATENT DOCUMENTS

| | | | | |
|---|---|---|---|---|
| 2002/0043895 | A1* | 4/2002 | Richards | F02B 75/34 310/328 |
| 2003/0234595 | A1* | 12/2003 | Takahashi | B41J 2/14233 310/324 |
| 2009/0115292 | A1* | 5/2009 | Ueda | H02N 2/043 310/338 |
| 2010/0226075 | A1* | 9/2010 | Jahge | G06F 1/1664 361/679.01 |
| 2012/0105333 | A1 | 5/2012 | Maschmeyer | |
| 2012/0119620 | A1* | 5/2012 | Xu | H02N 2/186 310/328 |
| 2012/0133494 | A1* | 5/2012 | Cruz-Hernandez | G06F 3/016 340/407.2 |

FOREIGN PATENT DOCUMENTS

EP    1324403 A1    7/2003

OTHER PUBLICATIONS

DiPrima, M.A., et al.. "Cyclic compression behavior of epoxy shape memory polymer foam", Mechanics of Materials, vol. 42, Issue 4, Apr. 2010, Abstract, 1 pg.

(Continued)

*Primary Examiner* — Shawki S Ismail
*Assistant Examiner* — Bryan Gordon
(74) *Attorney, Agent, or Firm* — Harrington & Smith (57) ABSTRACT

An apparatus including polymer configured to have a first state or a second state, wherein the volume of the polymer in the first state is different to a volume of the polymer in the second state; an actuator configured to be controlled by an input signal to cause the polymer to change between the first state and the second state; and a constraint configured to constrain the polymer in at least a first direction when the polymer changes between the first state and the second state.

18 Claims, 5 Drawing Sheets

(56) References Cited

OTHER PUBLICATIONS

Cohen Stuart, M.A., et al., "emerging applications of stimuli-responsive polymer materials", Nature Materials, vol. 9, Feb. 2010, 13 pgs.
Meng, H. et al., "A Brief of Stimulus-active Polymers Responsive to Thermal, Light, Magnetic, Electric, and Water/Solvent Stimuli", Journal of Intelligent Material Systems and Structures, vol. 21, Jun. 2010, 28 pgs.
Chaterji et al. *Smart Polymeric Gels: Redefining the Limits of Biomedical Devices*, Progress in Polymer Science, Pergamon Press, Oxford, GB, vol. 32, No. 8-9, Aug. 7, 2007 pp. 1084-1122.

\* cited by examiner

APPARATUS THAT CHANGES PHYSICAL STATE AND A METHOD

TECHNOLOGICAL FIELD

Embodiments of the present invention relate to an apparatus that changes physical state and a method. In particular, some examples relate to user interfaces.

BACKGROUND

Some apparatus, such as haptic apparatus, produce a change in physical state of the haptic apparatus that is sensed by a user via touch.

The size and scale of the physical changes of the haptic apparatus may not be significant enough.

BRIEF SUMMARY

According to various, but not necessarily all, embodiments of the invention there is provided an apparatus comprising: polymer configured to have a first state or a second state, wherein the volume of the polymer in the first state is different to a volume of the polymer in the second state; an actuator configured to be controlled by an input signal to cause the polymer to change between the first state and the second state; and a constraint configured to constrain the polymer in at least a first direction when the polymer changes between the first state and the second state.

According to various, but not necessarily all, embodiments of the invention there is provided a method comprising: causing an actuator to change a polymer between a first state and a second state, wherein the volume of the polymer in the first state is different to the volume of the polymer in the second state; and constraining the polymer in at least a first direction when the polymer changes between the first state and the second state.

According to various, but not necessarily all, embodiments of the invention there is provided an apparatus comprising a pre-stressed polymer configured to have a first state and a second state, wherein the volume of the polymer in the first state is different to the volume of the polymer in the second state; and an actuator configured to be controlled by an input signal to cause the polymer to change between the first state and the second state; wherein pre-stressing of the polymer causes the polymer to change volume asymmetrically and preferably in at least a particular direction.

According to various, but not necessarily all, embodiments of the invention there is provided examples as claimed in the appended claims.

BRIEF DESCRIPTION

For a better understanding of various examples that are useful for understanding the brief description, reference will now be made by way of example only to the accompanying drawings in which.

DETAILED DESCRIPTION

Some, but not necessarily all examples described in the following description enable a significant physical change in an apparatus 2. This significant physical change may be for example a change in volume and it may be of such a size and scale that it is visible to a user of the apparatus 2. This enables the production of user interfaces that provide information by changing their shape and/or configuration. An example of a visual user interface is a three dimensional relief display, where a physical change in the relief of the display caused by a volume change of a polymer provides information visually to a user.

The following figs relate to an apparatus 2 comprising: polymer 10 configured to have a first state 11 or a second state 12, wherein the volume of the polymer 10 in the first state 11 is different to a volume of the polymer in the second state 12;

an actuator 20 configured to be controlled by an input signal 22 to cause the polymer 10 to change between the first state 11 and the second state 12; and a constraint 30 configured to constrain the polymer 10 in at least a first direction 32 when the polymer 10 changes between the first state 11 and the second state 12.

This provides the technical effect of controlling a volume change of the apparatus 2. The apparatus may be for providing an indication to a user. This information may be provided via touch (a tactile indication) and/or sight (a visual indication)

Figures 1, 2, 3:
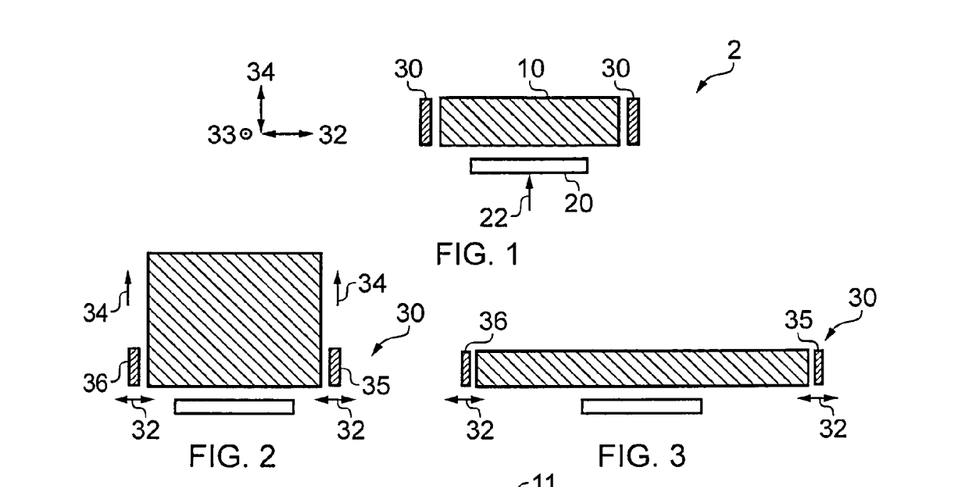
FIG. 1 illustrates an example of an apparatus that can change its physical shape.
FIG. 2 illustrates an example of the apparatus of FIG. 1 where the polymer is in a second state and where the constraint has a fixed configuration.
FIG. 3 illustrates an example of the apparatus as illustrated in FIG. 1, where the polymer is in the second state and wherein the constraint is moveable.

FIG. 1 illustrates an example of an apparatus 2 that can change its physical shape. The apparatus 2 comprises polymer 10 which has a first state 11 and a second state 12 (illustrated in FIG. 4). The volume of the polymer 10 in the first state 11 is different to the volume of the polymer 10 in the second state 12. In the example of FIG. 1, the polymer is in the first state which, in this example, is a lower volume state.

The apparatus 2 comprises an actuator 20 that is configured to be controlled by an input signal 22 to cause the polymer 10 to change between the first state 11 and the second state 12. The change in the polymer 10 from the first state 11 to the second state 12 is illustrated with reference to FIGS. 2 and 3. FIGS. 2 and 3 illustrate the polymer 10 in a second state 12.

The apparatus 2 also comprises a constraint 30 configured to constrain the polymer 10 in at least a first direction 32 when the polymer changes between the first state 11 and the second state 12.

In this document, the "first direction" is any vector in a plane that is parallel to a reference vector in that plane, thus constraining the polymer 10 in the first direction means constraining the polymer in both senses of the first direction. The constraint 30 may define a void between two opposing constraint elements.

In the example of FIGS. 2 and 3, but not necessarily all examples, the constraint 30 comprises a first constraint member 35 and a second constraint member 36 which opposes the first constraint member 35 in the first direction 32. A portion of the polymer 10 is located between the first constraint member 35 and the second constraint member 36 in the first state. A portion of the polymer 10 is located between the first constraint member 35 and the second constraint member 36 in the second state.

In the example of FIG. 2, the constraint 30 has a fixed configuration. The first constraint member 35 and the second constraint member 36 are configured so that they have a fixed relationship and do not move relative to each other in the first direction 32.

When the actuator 20 causes the polymer 10 to change from the first state 11 to the second state 12, the polymer 10 expands. The constraint 30 constrains expansion of the polymer 10 in the first direction 32 and the polymer 10 expands significantly in a second direction 34 which, in this example is orthogonal to the first direction 32. The expansion may be measured as a bulk volume expansion and may exceed a 10 percent increase in bulk volume.

In some examples, but not necessarily all examples, the constraint 30 may additionally comprise constraint members that constrain the expansion of the polymer 10 in a third direction 33 orthogonal to both the first direction 32 and the second direction 34. In this example, the constraint 30 may form a cell structure that constrains the polymer in both the first direction 32 and the third direction 33 but not wholly in the second direction 34.

In the example of FIG. 3, the constraint 30 is a moveable or reconfigurable constraint that is configured to move in at least the first direction 32. In the example illustrated, but not necessarily all examples, the first constraint member 35 and the second constraint member 36 are configured to move relative to each other in at least the first direction 32. When the actuator 20 causes the polymer 10 to change from the first state 11 to the second state 12 and expand, the expanding polymer 10 pushes the first constraint member 35 and the second constraint member 36 further apart. There is therefore a significant expansion in the first direction 32. There may or may not be significant expansion in addition in the second direction 34 and third direction 33.

The increase in bulk volume between the first state 11 and the second state 12, in FIG. 2 or 3, may be an increase in volume in excess of 10 percent.

In the examples of FIG. 2 and FIG. 3, the polymer 10 may, in some examples be unconnected with the constraint 30 such that it is in an abutting relationship to the constraint 30 in at least the second state 12 but is not permanently attached to the constraint 30. In other examples, the polymer 10 may be attached to the constraint 30.

Figure 4:
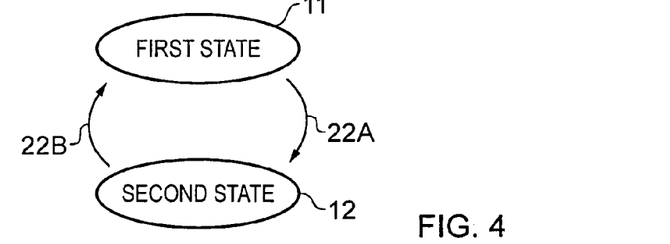
FIG. 4 illustrates a state diagram in which transitions between the first state of the polymer and the second state of the polymer are illustrated.

FIG. 4 illustrates a state diagram in which the transitions between the first state 11 of the polymer 10 and the second state 12 of the polymer 10 are illustrated. As described in relation to FIGS. 1 to 3, an actuator 20 is configured to be controlled by an input signal 22 to cause the polymer 10 to change between the first state 11 and the second state 12.

In the illustrated example, a first input signal 22A is illustrated as causing the polymer 10 to change from the first state 11 to the second state 12 and a second input signal 22B is illustrated as causing the polymer to change between the second state 12 and the first state 11.

The actuator 20 is configured to be controlled by the first input signal 22A to cause the polymer 10 to change from the first state 11 to the second state 12 and the actuator 20 is configured to be controlled by the second input signal 22B to cause the polymer to change from the second state 12 to the first state 11.

In some embodiments, the first input signal 22A may need to be maintained to maintain the polymer 10 in the second input state 12, the removal of the first input signal 22A being the second input signal 22B.

In some examples, the second input signal 22B may need to be maintained to maintain the polymer in the first state 11 after it has transitioned from the second state 12.

In some examples, the first input signal 22A may be a temporary signal that has a limited first duration and the polymer 10 may remain in the second state 12, in the absence of the temporary first input signal, for a duration longer than the first duration of the temporary first input signal 22A. That is, the temporary first input signal 22A may switch the state of the polymer from a first stable state 11 to a second stable state 12, where the second stable state 12 is maintained without the presence of the first input signal 22A. The polymer 10 may be bi-stable.

In some examples, the polymer 10 may remain in the second stable state 12 permanently and it may not be possible to return the polymer 10 to its first state 11. In other examples, the polymer 10 may remain in the second stable state 12 until the actuator 20 is controlled by the second input signal 22B.

The actuator 20 may also be configured to be controlled by a temporary second input signal 22B, having a second duration, to cause the polymer 10 to change from the second state 12 to the first state 11. The polymer 10 may remain in the first state 11, in the absence of the temporary second input signal 22B, for a duration longer than the second duration of the temporary second input signal 22B. Thus the actuator 20 may switch the polymer 10 from a second stable state 12 to a first stable state 11.

In some examples, the actuator 20 may comprise a single component. In other examples, the actuator 20 may comprise multiple components, where one of the components is controlled by the first input signal 22A and the other of the components is controlled by or controlled to provide the second input signal 22B. For example, a first component may be a particular micro electro-mechanical system (MEMS) and the second component may be a different micro electro-mechanical system (MEMS).

The input signal 22, whether the first input signal 22A or the second input signal 22B, that controls the actuator 20 to cause the polymer 10 to change state, may, in some but not necessarily all examples, enable provision or removal of electrons or heat. For example, one of the first, input signals 22A and the second input signal 22B may enable the provision of electrons (e.g. draw an electric current, change pH, add an oxidising agent) or heat (e.g. provide heat or stop sinking heat) and the other of the first input signal 22A and the second input signal 22B may enable the removal of electrons (e.g. provide an electric current, change pH, add a reducing agent) or heat (e.g. stop providing heat or start sinking heat).

For example, the first and second input signals 22A and 22B may be electrical signals, where one of the signals provides an electric current and the other of the signals removes an electric current.

For example, one of the first or second input signals 22A, 22B may cause provision of a reduction agent to the polymer 10 and the other may cause provision of an oxidation agent to the polymer 10. The oxidation or reduction agent may be effected by changing pH.

For example, one of the first input signal 22A or second input signal 22B, may provide heat to the polymer 10 and the other may sink heat from the polymer 10.

One or more micro electro-mechanical systems (MEMS) may be used, for example, in the provision of a reduction or oxidising agent to the polymer 10.

Figure 5A:
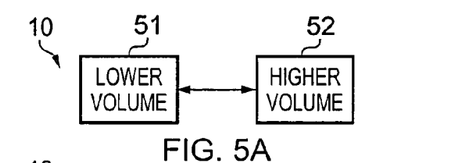
FIGS. 5A, 5B, 5C, 5D and 5E illustrate examples of a change in state of the polymer.

FIG. 5A illustrates an example of a change in state of the polymer 10. In a first state 11, the polymer 10 has a first lower volume configuration 51 and in the second state 12 the polymer 10 has a second higher volume configuration 52. The bulk volume of the polymer 10 in the second higher volume configuration 52 is significantly greater than the bulk volume of the polymer 10 in the first lower volume configuration 51. For example the bulk volume in the second higher volume configuration 52 may be more than 10 percent greater than the bulk volume in the first lower volume configuration 51. In some embodiments it may be more than 100 percent greater.

FIGS. 5B, 5C, 5D and 5E illustrate specific examples of the change of state illustrated in FIG. 5A. In these examples, the polymer 10 is comprised of polymer chains and the density of the polymer chains is changed when the polymer changes from the first state 11 to the second state 12. In these examples, the higher volume configuration 52 corresponds to a chain-stretched state, in which the polymer chains are extended and the lower volume configuration 51 corresponds to a chain-packed state, in which the polymer chains are not extended.

In some examples, the higher volume configuration 52 may result in increased volume because of excluded volume repulsions between the polymer chains.

In some examples, the second higher volume configuration 52 may arise as a consequence of a change in the cross-linking between polymer chains. In some examples the cross-linking may be as a result of Van der Waals forces which bind the polymer chains at specific points. The points at which the Van der Waals forces cross-link the polymer chains are different in the first low volume configuration 51 compared to the second higher volume configuration 52.

In some examples, the polymer 10 may be a foam that comprises gas (e.g. air) filled interstitial spaces, in at least one of the first and second states 11, 12.

Figure 5B:
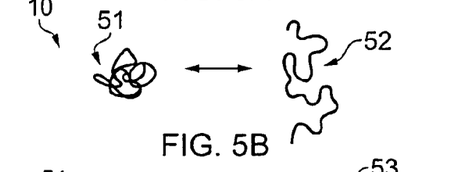

FIG. 5B schematically illustrates a change in polymer chain density.

Figure 5C:
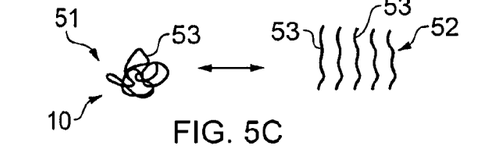

FIG. 5C illustrates a polymer 10 comprised of a single polymer species (homopolymer 53).

Figure 5D:
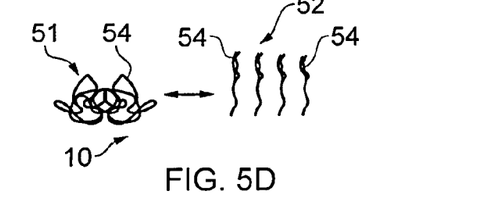

FIG. 5D illustrates a polymer 10 comprised of a single polymer species (a block copolymer 54).

Figure 5E:
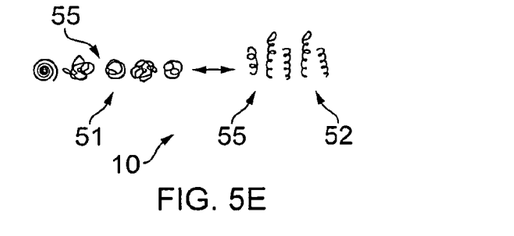

FIG. 5E illustrates a polymer 10 comprising an aggregate 55 of different polymer species.

Different polymers 10 may be selected to achieve different effects. For example, a change in state of a polymer 10 may be characterised by a number of parameters including the rate of response of the polymer 10 to an input signal 22, the magnitude of the volume change, the intensity of the stimulus that is required from the actuator 20 to trigger the change in state, and whether or not the change in state of the polymer 10 is reversible.

There are a range of different polymers which may be suitable for use as the polymer 10 including poly(N-isopropylacrylamide) PNIPAAM; polyelectrolyte e.g. poly(allylamine hydrochloride) PAH; triblock poly(styrene-block-2-vinylpyridine-block-ethylene oxide) (PS-b-P2VP-b-PEO copolymer); poly(2-vinylpyridine) P2VP.

Figure 6A:
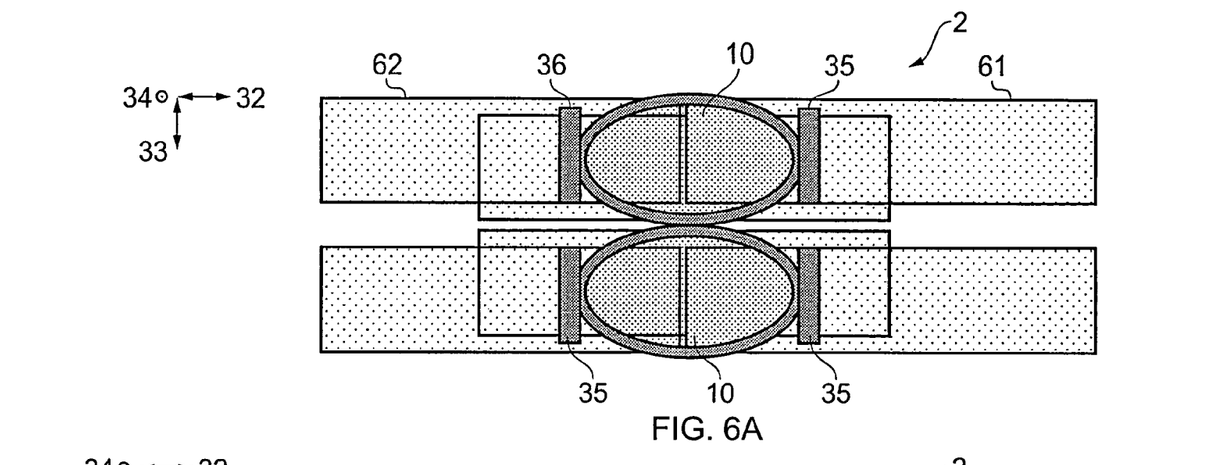
FIGS. 6A and 6B illustrate an example of the apparatus in which the constraint is reconfigurable.
Figure 6B:
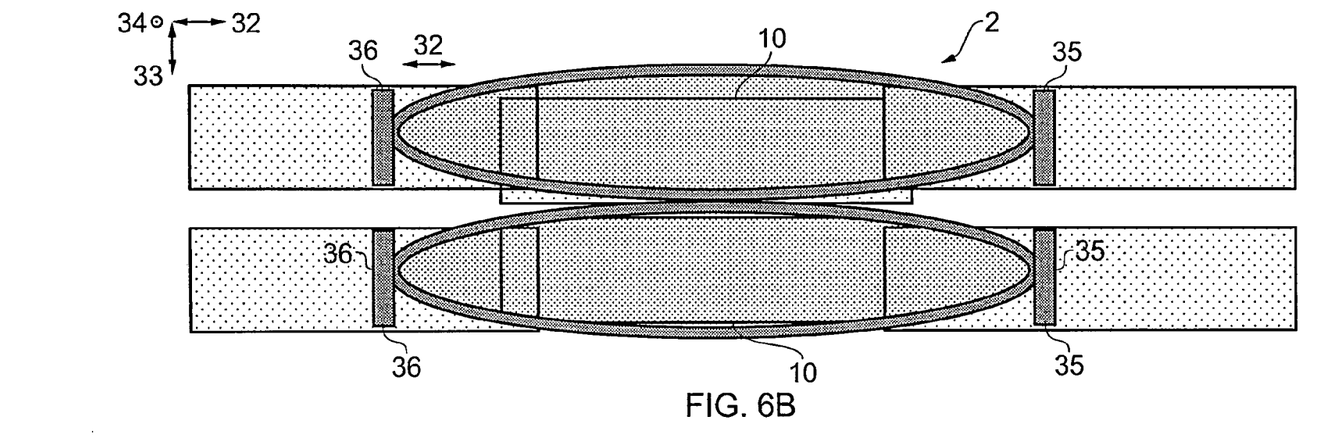

FIGS. 6A and 6B illustrate an example of the apparatus 2 in which the constraint 30 is reconfigurable, for example, as described in relation to FIGS. 1 and 3. FIG. 6A corresponds to FIG. 1 and FIG. 6B corresponds to FIG. 3 and similar reference numerals are used to refer to similar features.

In the example of FIGS. 6A & 6B, the polymer 10 has been pre-stressed so that it expands asymmetrically. In this example the polymer 10 expands preferentially in the first direction 32 but does not expand to the same extent in the third direction 33 orthogonal to the first direction 32 (as shown) and also, optionally, does not expand to the same extent in the second direction 34.

In the example of FIGS. 6A & 6B, the first constraint member 35 is supported by a first carriage 61 and the second constraint member 36 is supported by a second carriage 62. In the first state 11 of the polymer 10 illustrated in FIG. 6A the first and second carriages are in close proximity whereas in the second state 12 illustrated in FIG. 6B, the polymer 10 has separated the first and second carriages 61, 62.

Figures 7A, 7B:
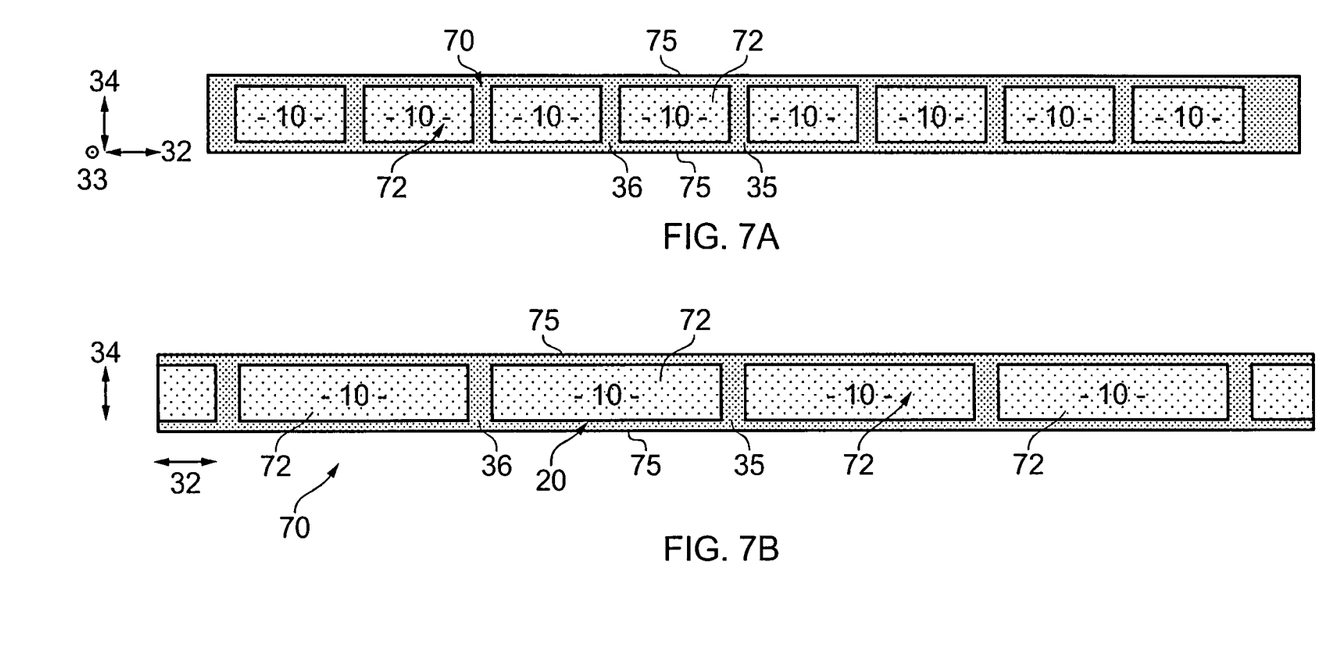
FIGS. 7A and 7B illustrate an example of the apparatus comprising a closed-cell expandable structure.

FIG. 7 illustrates an apparatus 2. In this example, the constraint 30 is provided by a closed-cell expandable structure 70 which comprises a series of laterally interconnected expandable cells 72 enclosing the polymer 10.

The first constraint member 35 and the second constraint member 36 are provided by the lateral walls of a cell 72 of the closed-cell structure 70. These cell walls may be rigid or semi-rigid and resist strain in the second direction 34. The upper and lower cell walls 75 however do not significantly resist strain in the first direction 32. Therefore when the polymer 10 changes from the first state 11 in FIG. 7A to the second state 12 in FIG. 7B, the depth of the closed-cell structure 70 in the second direction 34 remains substantially constant whereas the width of the closed-cell structure in the first direction 32 increases significantly. In some examples the cells 72 may be configured to expand in the third direction 33 orthogonal to the first direction 32 and second direction 34 and in other examples the cells 72 may be configured not to expand in the third direction.

Figure 8:
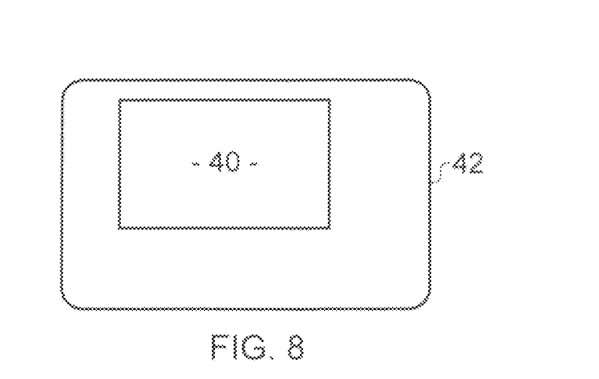
FIG. 8 illustrates an example of a device comprising a user interface.

FIG. 8 illustrates an example of a device 42 comprising a user interface 40. The device 42 may be, for example, a hand-portable device or a desktop device or other type of device. The device may be a stretchable device comprising a stretchable body that supports one or more apparatuses 2.

The user interface 40 is configured to provide an indication to a user of the device 42 when the polymer 10 of the apparatus 2 changes state. The user interface 40 comprises the apparatus 2 as previously described. It may comprise a multiple number of the apparatus 2 as previously described.

In some, but not necessarily all examples, the user interface 40 may be a visual user interface and the indication may be provided via sight as a visual indication.

In some, but not necessarily all examples, the user interface 40 may additionally or alternatively be a touch user interface and the indication may be provided via touch as a tactile indication.

A user interface 40 may, for example, be a dedicated output user interface that provides output only and does not provide input. Alternatively, it may additionally provide for user input.

A three dimensional (3D) relief display is an example of a visual user interface 40. The three dimensionality of the 3D-relief display may be provided by the polymer 10 when it expands on changing state from the first state 11 to the second state 12. This expansion may create variable three-dimensional relief on an upper surface of the visual user interface 40. Relief in this sense describes a change in projection or elevation of the upper surface of the visual user interface 40 from a plane.

In some but not necessarily all examples, a user interface 40 is located on a front face of the device 42.

In some but not necessarily all examples, a user interface 40 is located on a back (rear) face of the device 42.

Figure 9:
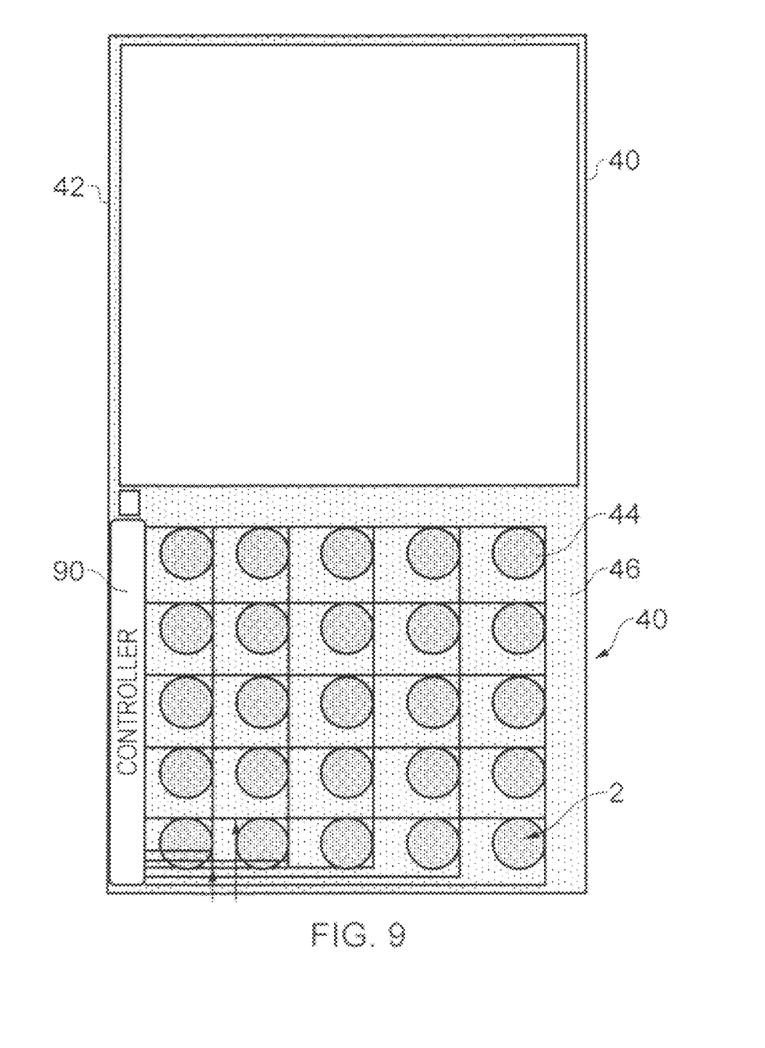
FIG. 9 illustrates an example of a user interface comprising discrete controllable elements provided by apparatuses.

FIG. 9 illustrates an example of a user interface 40 comprising a number of discrete controllable elements 44. Each discrete controllable element 44 may be provided by an apparatus 2 as previously described. This is illustrated in more detail, for example, in FIG. 10. Each discrete controllable element 44 may be controlled to have a different relief (e.g. a different height).

In the example of FIG. 9, the discrete controllable elements 44 are arranged in a regular array of rows and columns and are evenly spaced. When the polymer 10 of a discrete controllable element 44 changes state from the first state 11 to the second state 12 the discrete controllable element 44 extends outwardly from an outer surface 46 of the device 42. A controller 90 may be used to selectively actuate different ones of the discrete controllable elements 44 at different times and therefore provide three dimensional relief. The controller 90 may, in some examples, be configured to control a height of each discrete controllable element 44 above the outer surface 46 of the device 42.

Figure 10:
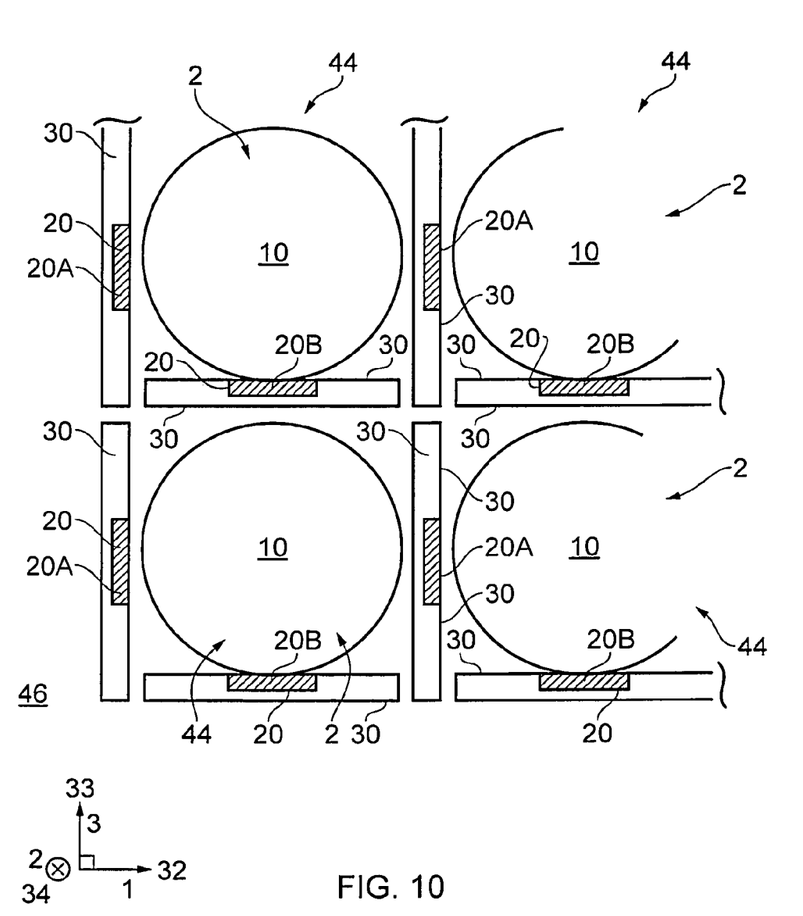
FIG. 10 illustrates an example of discrete controllable elements for user interfaces.

In the example of FIG. 10, each of the discrete controllable element 44 comprises an actuator 20 that has a first component 20A and a second component 20B. The first component 20A may be a first micro electro-mechanical system (MEMS) and the second actuator 20B may be a second micro electro-mechanical system (MEMS). In some examples the first actuator 20A may be used to change the state of the polymer 10 from the first state 11 to the second state 12 and the second actuator 20B may be used to change the state of the polymer 10 from the second state 12 to the first state 11.

Each discrete controllable element 44 constrains the polymer 10 in a first direction 32 and the third direction 33 using fixed walls which operate as constraints 30. This is similar to the example illustrated in FIG. 2. The fixed walls form a void that is occupied by the polymer 10. When the polymer 10 changes from the first state 11 to the second state 12 it expands in the second direction 34 away from the outer surface 46 of the device 42.

FIGS. 9 and 10 illustrate an example of a user interface 40 comprising a number of discrete controllable elements 44. Where the user interface is a visual user interface 40, for example a 3D-relief display, the discrete controllable elements 44 correspond to picture elements (pixels) of the 3D-relief display. Where the user interface is a tactile user interface 40, the discrete controllable elements 44 correspond to picture elements (pixels) of the image projected onto the tactile user interface 40 as relief.

Figure 11:
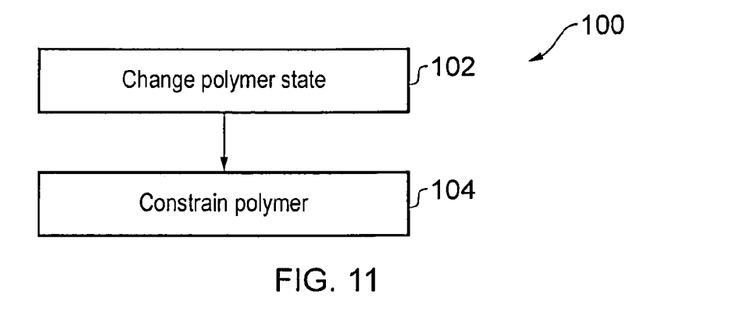
FIG. 11 illustrates a method.

FIG. 11 illustrates an example of a method 100.

At block 102, the method proceeds by causing an actuator 20 to change a polymer 10 between a first state 11 and a second state 12, wherein the volume of the polymer in the first state 11 is different to the volume of the polymer in the second state 12.

At block 104, the method constrains the polymer 10 in at least a first direction 32 when the polymer 10 changes between the first state 11 and the second state 12.

Some of the examples described above describe how the expansion of the polymer 10 in a particular direction is discouraged/prevented and the expansion of the polymer in other directions is facilitated. This may be achieved, for example, by using fixed constraints 30 or by pre-stressing the polymer. In some implementations the apparatus 2 may comprise: pre-stressed polymer 10 configured to have a first state 11 and a second state 12, wherein the volume of the polymer 10 in the first state 11 is different to the volume of the polymer 10 in the second state 12; and an actuator 20 configured to be controlled by an input signal 22 to cause the polymer to change between the first state 11 and the second state 12; wherein pre-stressing of the polymer 10 causes the polymer to change volume asymmetrically and preferably in at least a particular direction. Thus pre-stressing the polymer may render the constraint 30 optional.

In the above description, various actuators 20 are described. These actuators 20 provide means for changing the polymer state between the first state 11 and the second state 12.

In the above description, various constraints 30 are described. These constraints provide means for constraining expansion of the polymer. In some embodiments, they may additionally provide means for facilitating expansion of the polymer in a different direction.

In the above description, various means for facilitating expansion of the polymer in a particular direction are described. These means may include some constraints 30 and/or pre-stressing the polymer 10.

In the example of FIGS. 6A & 6B, the constraint 30 is provided by a first constraint member 35 and a second constraint member 36. In other embodiments, the constraint 30 may be provided by an expandable encasement such as a balloon or bubble that encloses, at least partially, the polymer 10. If asymmetric expansion is desired, it may be achieved by pre-stressing the polymer 10 and/or pre-stressing the expandable encasement 30.

As used here 'module' refers to a unit or apparatus that excludes certain parts/components that would be added by an end manufacturer or a user to create a device. The apparatus 2 may be a module or may be comprised in a module. The apparatus 2 may be a device or may be comprised in a device.

The controller 90 may be implemented as controller circuitry. The controller 90 may be implemented in hardware alone, have certain aspects in software including firmware alone or can be a combination of hardware and software (including firmware). The controller 90 may be implemented using instructions that enable hardware functionality, for example, by using executable computer program instructions in a general-purpose or special-purpose processor that may be stored on a computer readable storage medium (disk, memory etc) to be executed by such a processor.

References to 'controller', 'processor' etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term 'example' or 'for example' or 'may' in the text denotes, whether explicitly stated or not, that such features or functions are present in at least the described example, whether described as an example or not, and that they can be, but are not necessarily, present in some of or all other examples. Thus 'example', 'for example' or 'may' refers to a particular instance in a class of examples. A property of the instance can be a property of only that instance or a property of the class or a property of a sub-class of the class that includes some but not all of the instances in the class.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
    polymer configured to have a first state or a second state, wherein the volume of the polymer in the first state is different from a volume of the polymer in the second state;
    an actuator configured to be controlled by an input signal to cause the polymer to change between the first state and the second state; and
    a constraint configured to constrain the polymer in at least a first direction when the polymer changes between the first state and the second state;
    wherein the constraint comprises a closed-cell expandable structure comprising at least two laterally interconnected expandable cells; and
    wherein the input signal is a temporary first input signal that causes the polymer to change from the first state to the second state, wherein the polymer remains in the second state, in the absence of the temporary first input signal, for a duration longer than a duration of the temporary first input signal.

2. An apparatus as claimed in claim 1 wherein the polymer provides a user interface configured to provide an indication to a user when the polymer changes state.

3. An apparatus as claimed in claim 1, wherein the actuator controls a controllable element of a three dimensional relief display, wherein a third dimension of the three dimensional relief display is provided by a change in the state of the polymer.

4. An apparatus as claimed in claim 1 wherein the actuator is configured to be controlled by a first input signal to cause the polymer to change from the first state to the second state and configured to be controlled by a second input signal to cause the polymer to change from the second state to the first state.

5. An apparatus as claimed in claim 4, wherein one of the first input signal and the second input signal is configured to enable provision of heat or electrons to the polymer and the other of the first input signal and the second input signal is configured to enable removal of heat or electrons from the polymer.

6. An apparatus as claimed in claim 1, wherein the actuator comprises at least one micro electro-mechanical system used for the delivery of a stimulus to effect a change in state of the polymer.

7. An apparatus as claimed in claim 6, wherein a micro electro-mechanical system of an actuator is configured to provide an oxidising agent and another micro electro-mechanical system of the actuator is configured to provide a reducing agent.

8. An apparatus as claimed in claim 1, wherein an actuator is configured to be controlled by a temporary second input signal to cause the polymer to change from the second state to the first state, wherein the polymer remains in the first state, in the absence of the temporary second input signal, for a duration longer than the duration of the temporary second input signal.

9. An apparatus as claimed in claim 1, wherein the polymer has a chain density that varies between the first state and the second state and wherein the second state corresponds to a state in which polymer chains are stretched and the first state corresponds to a state in which the polymer chains are less stretched.

10. An apparatus as claimed in claim 1, wherein in the first state the polymer has a first cross-linking configuration and in the second state the polymer has a second, different, cross-linking configuration.

11. An apparatus as claimed in claim 1, wherein the polymer is a foam comprising gas-filled interstitial spaces.

12. An apparatus as claimed in claim 1, wherein the polymer comprises a homopolymer or block copolymer or an aggregate of different polymer species.

13. An apparatus as claimed in claim 1, wherein the polymer in the second state has a bulk volume that is greater than a bulk volume in the first state by at least 10 percent.

14. An apparatus as claimed in claim 1, wherein the constraint comprises at least a first constraint portion and a second opposing constraint portion, wherein the first constraint portion and the second constraint portion are opposing in the first direction and wherein at least a portion of the polymer is located between the first constraint portion and the second constraint portion in the first state and wherein at least a portion of the polymer is located between the first constraint portion and the second constraint portion in the second state.

15. An apparatus as claimed in claim 1, wherein the apparatus is a stretchable apparatus comprising a stretchable body.

16. An apparatus as claimed in claim 1, wherein the polymer is pre-stressed, wherein pre-stressing causes the polymer to change volume asymmetrically and preferably at least in a particular direction.

17. A method comprising:
    causing an actuator to change a polymer between a first state and a second state, wherein the volume of the polymer in the first state is different from the volume of the polymer in the second state; and constraining the polymer in at least a first direction when the polymer changes between the first state and the second state;

wherein the constraint comprises a closed-cell expandable structure comprising at least two laterally interconnected expandable cells; and wherein the actuator is configured to be controlled by a temporary first input signal that causes the polymer to change from the first state to the second state, wherein the polymer remains in the second state, in the absence of the temporary first input signal, for a duration longer than a duration of the temporary first input signal.

18. An apparatus comprising a pre-stressed polymer configured to have a first state and a second state, wherein the volume of the polymer in the first state is different from the volume of the polymer in the second state; and an actuator configured to be controlled by an input signal to cause the polymer to change between the first state and the second state;

wherein pre-stressing of the polymer causes the polymer to change volume asymmetrically and preferably in at least a particular direction;

wherein the asymmetric change in volume is constrained by a closed-cell expandable structure comprising at least two laterally interconnected expandable cells that resist strain in a first direction and do not significantly resist strain in a second direction; and wherein the actuator configured to be controlled by the input signal causes the polymer to change from the first state to the second state, wherein the polymer remains in the second state, in the absence of the input signal, for a duration longer than a duration of the input signal.

* * * * *